United States Patent
Liu et al.

(10) Patent No.: US 8,842,231 B2
(45) Date of Patent: Sep. 23, 2014

(54) ARRAY SUBSTRATE AND MANUFACTURING METHOD THEREOF

(75) Inventors: Xiang Liu, Beijing (CN); Seongyeol Yoo, Beijing (CN); Jianshe Xue, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 269 days.

(21) Appl. No.: 13/150,376

(22) Filed: Jun. 1, 2011

(65) Prior Publication Data

US 2011/0299004 A1 Dec. 8, 2011

(30) Foreign Application Priority Data

Jun. 3, 2010 (CN) .......................... 2010 1 0197073

(51) Int. Cl.
*G02F 1/136* (2006.01)
*H01L 29/786* (2006.01)
*H01L 27/12* (2006.01)
*G02F 1/1362* (2006.01)

(52) U.S. Cl.
CPC ...... *H01L 27/1214* (2013.01); *H01L 29/78696* (2013.01); *G02F 1/136209* (2013.01); *H01L 27/1225* (2013.01); *H01L 29/78633* (2013.01)
USPC ................... 349/46; 349/47; 349/44; 349/43; 257/59; 257/72; 257/63; 257/61

(58) Field of Classification Search
CPC ..................................................... H01L 33/005
USPC .......... 349/47, 44, 43, 42, 51, 54, 92; 257/59, 257/72, 63, 61
See application file for complete search history.

(56) References Cited

U.S. PATENT DOCUMENTS

| | | | | |
|---|---|---|---|---|
| 4,723,838 A | * | 2/1988 | Aoki et al. ...................... | 349/47 |
| 5,191,453 A | * | 3/1993 | Okumura ........................ | 349/47 |
| 5,872,370 A | * | 2/1999 | Gu et al. ......................... | 257/66 |
| 6,569,707 B2 | * | 5/2003 | Dimitrakopoulos et al. ... | 438/99 |
| 7,491,987 B2 | * | 2/2009 | Genrikh et al. ................ | 257/256 |
| 2002/0097365 A1 | * | 7/2002 | Yang et al. ..................... | 349/141 |
| 2004/0051822 A1 | * | 3/2004 | Sato ................................ | 349/43 |
| 2004/0140515 A1 | | 7/2004 | Yasukawa | |
| 2006/0267012 A1 | * | 11/2006 | Maegawa et al. ............... | 257/57 |
| 2006/0278877 A1 | * | 12/2006 | Kim et al. ....................... | 257/72 |
| 2007/0291195 A1 | | 12/2007 | Kim et al. | |
| 2008/0116457 A1 | * | 5/2008 | Park et al. ...................... | 257/59 |
| 2008/0191210 A1 | * | 8/2008 | Hiroshima ...................... | 257/59 |
| 2010/0123654 A1 | * | 5/2010 | Kimura .......................... | 345/92 |
| 2011/0012115 A1 | * | 1/2011 | Jeon et al. ...................... | 257/59 |
| 2011/0134378 A1 | * | 6/2011 | Tsuboi et al. ................. | 349/110 |
| 2011/0147742 A1 | * | 6/2011 | Sambandan et al. ........... | 257/57 |

FOREIGN PATENT DOCUMENTS

| | | |
|---|---|---|
| CN | 1474219 A | 2/2004 |
| CN | 1510717 A | 7/2004 |
| CN | 101067705 A | 11/2007 |
| CN | 101093328 A | 12/2007 |
| CN | 101136376 A | 3/2008 |

* cited by examiner

*Primary Examiner* — Edward Glick
*Assistant Examiner* — Sang V Nguyen
(74) *Attorney, Agent, or Firm* — Ladas & Parry LLP

(57) ABSTRACT

An array substrate comprises: a base substrate; a gate scanning line, a data scanning line, a pixel electrode and a thin film transistor, formed on the base substrate; and a light blocking layer, formed on the base substrate and corresponding to the thin film transistor and the data scanning line.

7 Claims, 10 Drawing Sheets

ARRAY SUBSTRATE AND MANUFACTURING METHOD THEREOF

BACKGROUND

Embodiments of the present invention relate to an array substrate and a manufacturing method thereof.

Currently, thin film transistors liquid crystal displays (TFT-LCDs) have advantages of excellent display quality, low manufacturing cost, low power consumption, no radiation and the like, and thus have predominated in the current flat plate display market. With developments of manufacture technologies, display quality of TFT-LCDs is gradually improved.

A TFT-LCD generally comprises a liquid crystal panel, a drive circuit and a backlight. The liquid crystal panel is the most important component in the TFT-LCD, and the liquid crystal panel is formed by injecting liquid crystal into the space between two glass substrates, then sealing a periphery of the substrates by using sealant, and attaching respectively two polarizer plates, whose polarization directions are perpendicular to each other, to the two glass substrates. Herein, the upper glass substrate is a color filter substrate, and a lower glass substrate is a TFT array substrate. A plurality of thin film transistors in a matrix arrangement and some peripheral circuits are manufactured on the TFT array substrate.

Generally, a black matrix is formed on the color filter substrate, and the material for the black matrix may be a non-transparent metal film, such as Cr film, and the metal film can reflect light. When light generated by the backlight transmits through the TFT array, a portion of the light is incident on the nontransparent metal film, and that portion of the light is reflected and mostly radiated on the semiconductor layer positioned at the channel of the TFT. The semiconductor layer is formed of a photosensitive material, and when being radiated by light, may give rise to dark current, and the dark current can increase the turning-off current of the TFT, thus reducing the retaining time of pixel charges, affecting a gray level change of the TFT-LCD, and an image flickering may occur in some situations.

SUMMARY

One embodiment of the present invention provides an array substrate, wherein the TFT array substrate comprises: a base substrate; a gate scanning line, a data scanning line, a pixel electrode and a thin film transistor, formed on the base substrate; and a light blocking layer, formed on the base substrate and corresponding to the thin film transistor and the data scanning line.

Another embodiment of the present invention provides a method of manufacturing an array substrate, the method comprising: forming a light blocking layer on a base substrate; depositing a first insulating layer on the base substrate on which the light blocking layer has been formed; forming an active thin film pattern on the first insulating layer; forming a source electrode and a drain electrode of a thin film transistor, a data scanning line connected to the source electrode and a pixel electrode connected to the drain electrode on the base substrate on which the active thin film pattern has been formed, the thin film transistor and the data scanning line corresponding to the light blocking layer; depositing a second insulating layer on the base substrate on which the pixel electrode, the data scanning line, the source and the drain have been formed; and forming a gate electrode of the thin film transistor corresponding to the active thin film pattern and a gate scanning line connected to the gate electrode on the base substrate on which the second insulating layer has been deposited.

Still another embodiment of the present invention provides a method of manufacturing an array substrate, the method comprising: forming a gate electrode of the thin film transistor and a gate scanning line connected to the gate electrode on a base substrate; depositing a first insulating layer on the base substrate on which the gate electrode and the gate scanning line have been formed; forming an active thin film pattern corresponding to the gate electrode on the first insulating layer; forming a source electrode and a drain electrode of the thin film transistor, a data scanning line connected to the source electrode and a pixel electrode connected to the drain electrode on the base substrate on which the active thin film pattern is formed; depositing a second insulating layer on the base substrate on which the pixel electrode, the data scanning line, the source electrode and the drain electrode are formed; and forming a light blocking layer corresponding to the thin film transistor and the data scanning line on the base substrate on which the second insulating layer has been deposited.

BRIEF DESCRIPTION OF THE DRAWINGS

The present invention will become more fully understood from the detailed description given hereinafter and the accompanying drawings which are given by way of illustration only and thus are not limitative of the present invention and wherein:

FIG. 2b is a sectional view taken along the A-B direction of FIG. 2a;

FIG. 3b is a sectional view taken along the A-B direction of FIG. 3a;

FIG. 5b is a sectional view taken along the A-B direction of FIG. 5a;

FIG. 6b is a sectional view taken along the A-B direction of FIG. 6a;

DETAILED DESCRIPTION

Some embodiments of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

First Embodiment

The present embodiment provides a TFT array substrate, wherein light blocking layers 2 and 16 are directly formed on a base substrate 1 and a gate scanning line 13 and a gate electrode 12 are positioned above a channel of the TFT.

Figure 1A:
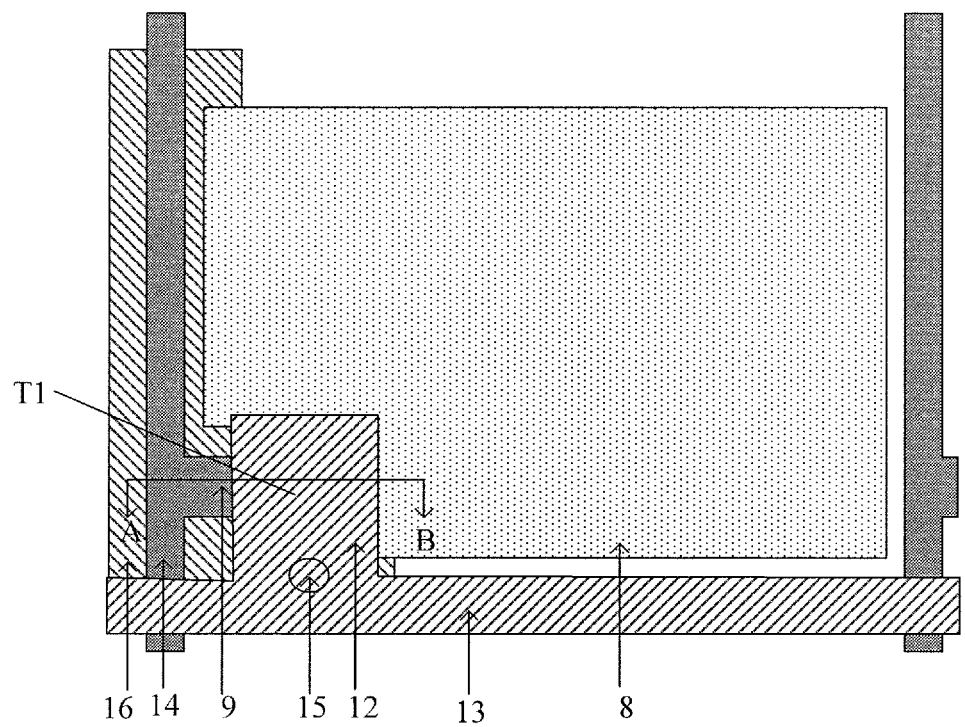
FIG. 1a is a plan view of a TFT array substrate according to a first embodiment of the present invention.
Figure 1B:
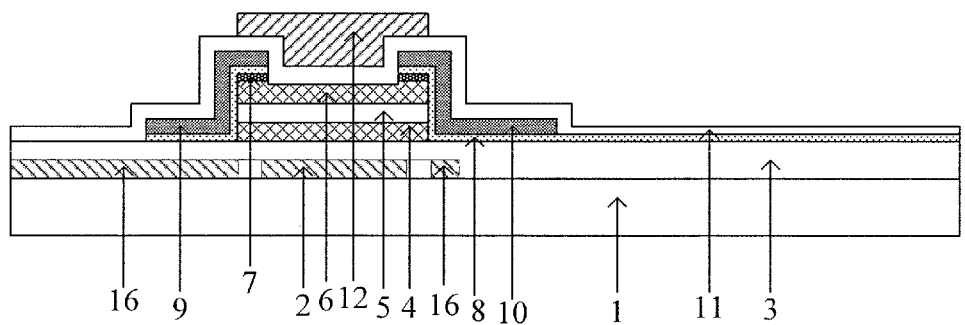
FIG. 1b is a sectional view taken along the A-B direction of the TFT array substrate according to the first embodiment of the present invention.

As shown in FIG. 1a and FIG. 1b, the TFT array substrate comprises: the base substrate 1; and the gate scanning line 13, a data scanning line 14, a pixel electrode 8 and a thin film transistor (TFT) T1 formed on the base substrate 1. The gate scanning line 13 and the data scanning line 14 are crossed with each other to define a pixel region, and the pixel electrode 8 and the thin film transistor T1 are formed within the pixel region. The gate electrode 12 of the thin film transistor T1 and the gate scanning line 13 are formed with a same metal layer by a photolitograph process and are connected to each other, and the source electrode 9 of the TFT T1 is connected to the data scanning line 14, and the drain electrode 10 of the TFT T1 is connected to the pixel electrode 8; and the light blocking layers 2 and 16 corresponding to the thin film transistor T1 and the data scanning line 14 are formed on the base substrate 1. FIG. 1a only shows one pixel region as an example, and there may be a plurality of pixel regions defined by a plurality of gate scanning lines and data scanning lines.

Further, the light blocking layers 2 and 16 are formed on the base substrate 1, and a first insulating layer 3 is formed on the base substrate on which the light blocking layers 2 and 16 are formed. The data scanning line 14, the pixel electrode 8 and the thin film transistor T1 are formed on the first insulating layer 3 on the base substrate 1. A second insulating layer 11 is formed on the data scanning line 14, the pixel electrode 8 and the thin film transistor T1 on the base substrate 1, the gate electrode 12 and the gate scanning line 13 are formed on the second insulating layer 11, and the gate electrode 12 corresponds to the channel of the thin film transistor T1 in a perpendicular direction.

Further, the light blocking layers 2 and 16 can also be used as a black matrix (BM) such that the BM is manufactured on the TFT array substrate, and as compared with the case in which a BM is manufactured on a color filter substrate, the width of the BM can be reduced and the aperture ratio of liquid crystal panel to be formed can be improved.

Figure 2A:
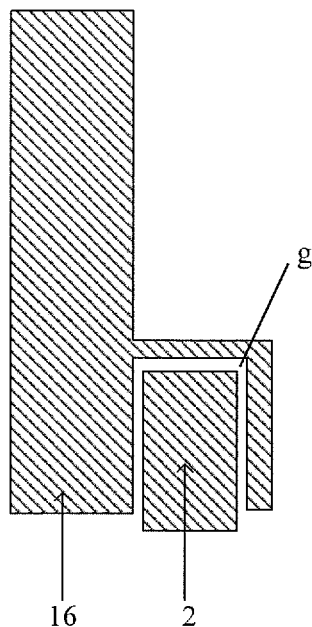
FIG. 2a is a plan view of the TFT array substrate after a first photolithograph process according to the first embodiment of the present invention.

In the present embodiment, the light blocking layer comprises two portions: a gate light blocking portion 2 and a scanning line light blocking portion 16. The gate light blocking portion 2 corresponds to the gate electrode 12, the scanning line light blocking portion 16 corresponds to the data scanning line 14, and there is a gap "g" between the gate light blocking portion 2 and the scanning line light blocking portion 16, as shown in FIG. 2a.

Further, a via hole 15 is formed through each of layers between the gate electrode 12 and the gate light blocking portion 2 (as shown in FIG. 1a), and the via hole 15 is positioned outside of the channel of the thin film transistor T1, the gate light blocking portion 2 is connected to the gate electrode 12 via a conductive material filled in the via hole 15.

An active thin film pattern is formed between the first insulating layer 3 and the second insulating layer 11. The active thin film pattern comprises a first semiconductor layer 4 and a second semiconductor layer 6, the first semiconductor layer 4 is spaced from the second semiconductor layer 6 via a semiconductor insulating layer 5 therebetween, the first semiconductor layer 4 is an oxide semiconductor layer, and the second semiconductor layer 6 is an amorphous silicon layer.

The first semiconductor layer 4 is formed on the first insulating layer 3, the semiconductor insulating layer 5 is formed on the first semiconductor layer 4, the second semiconductor layer 6 is formed on the semiconductor insulating layer 5, an ohmic contact layer 7 is formed on the second semiconductor layer 6, the pixel electrode 8 is positioned on the ohmic contact layer 7, and the source electrode 9 and the drain electrode 10 are formed above the pixel electrode 8. The data scanning line 14, the source electrode 9 and the drain electrode 10 are formed with a same metal layer by a photolithography process, and the gate scanning line 13 and the gate electrode 12 are formed with a same metal layer by a photolithography process. The gate electrode 12 is perpendicular to the gate scanning line 13, and the data scanning line 14 is perpendicular to the gate scanning line 13.

The gate electrode 12 and the gate light blocking portion 2 are connected to each other via the conductive material filled in the via hole 15, and two semiconductor layers are formed between the gate electrode 12 and the gate light blocking portion 2, thus a double-channel TFT structure is formed.

Because the two semiconductor layers are formed between the gate electrode 12 and the gate light blocking portion 2, each of the two semiconductor layers can be formed closer to the gate electrode 12 or the gate light blocking portion 2, so the conductive property of the TFT can be improved.

An area of the gate electrode 12 is larger than an area of the gate light blocking portion 2 and the gate electrode 12 covers the gap "g" between the gate light blocking portion 2 and the scanning line light blocking portion 16, and further, a black matrix is not formed on the color filter substrate facing the array substrate with an interposed liquid crystal layer, the gate electrode 12 can block the light from transmitting through the gap "g" between the gate light blocking portion 2 and the scanning line light blocking portion 16.

Herein, a material of the light blocking layer may be Cr or another metal material having an excellent light-blocking property.

The first insulating layer 3, the second insulating layer 11 and the semiconductor insulating layer 5 may be formed of a material selected from the group consisting of oxide, nitride and oxynitride.

The material for the pixel electrode 8 may be ITO (Indium Tin Oxide) or IZO (Indium Zinc Oxides, or other transparent metal or transparent metal oxide. The material for the source electrode 9 and the drain electrode 10 may be selected from the group consisting of Cr, W, Ti, Ta, Mo, Al, Cu and the like, and an alloy thereof, and the source electrode 9 and the drain electrode 10 may be formed in a single layer or in multiple layers.

The material for the gate scanning line 13 and the gate electrode 12 may be selected from the group consisting of Cr, W, Ti, Ta, Mo, Al, Cu and the like, and an alloy thereof, and the gate scanning line 13 and the gate electrode 12 may be formed in a single layer or in multiple layers.

The embodiment of the present invention provides a TFT array substrate, wherein a light blocking layer is directly formed on a base substrate, the light blocking layer is located below a TFT array and can prevent the light from a backlight and transmitting through the base substrate from directly radiating onto an active thin film pattern (a semiconductor layer) of a TFT. A gate electrode on an upper layer can prevent light within the liquid crystal panel after reflected by a black matrix from radiating onto the semiconductor layer at the channel of the TFT. Further, the gate electrode also can prevent other light within the liquid crystal panel from directly radiating onto the semiconductor layer at the channel of the TFT, and thus, the generation of dark current can be avoided, the retaining time of pixel charges can be maintained, and the display quality of the TFT-LCD can be improved. Two semiconductor layers are formed between the gate electrode and the gate light blocking portion, a via hole is formed through each of layers between the gate electrode and the gate light blocking portion and the gate electrode and the gate light blocking portion are connected to each other via the conductive material filled in the via hole, and thus, a double-channel TFT is formed and the electrical property of the TFT can be improved.

Further, the embodiment of the present invention also provides a method of manufacturing a TFT array substrate. The method comprises the following steps.

Step 601, forming a light blocking layer on a base substrate 1 by using a photolithograph process, and the light blocking layer comprises a gate light blocking portion 2 and a scanning line light blocking portion 16.

Firstly, depositing a light-blocking metal thin film with a thickness of 1000~4000 Å on the base substrate 1 by a sputtering method or a thermal evaporation method. The light-blocking metal thin film may be formed of Cr or other metal material having excellent light-blocking property.

Figure 2B:
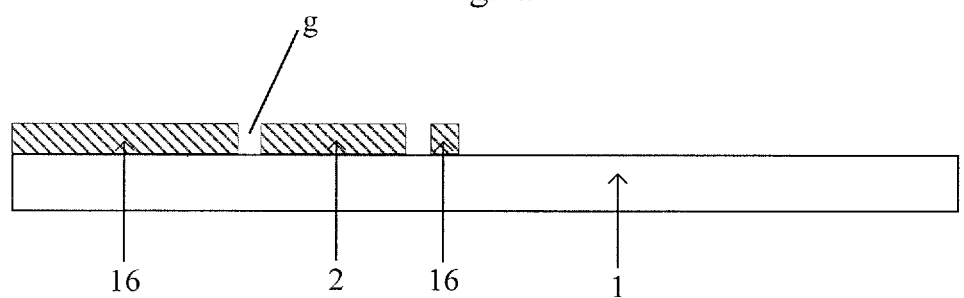

Then, forming the gate light blocking portion 2 and the scanning line light blocking portion 16 on the base substrate 1 by a photolithograph process. As shown in FIG. 2a and FIG. 2b, a gap "g" is formed between the gate light blocking portion 2 and the scanning line light blocking portion 16.

Step 602, sequentially depositing a first insulating layer 3, a first semiconductor layer 4, a semiconductor insulating layer 5, a second semiconductor layer 6 and an ohmic contact layer 7 on the base substrate 1 on which the gate light blocking portion 2 and the scanning line light blocking portion 16 have been formed, and then by using a photolithograph process, forming an active thin film pattern.

Firstly, on the base substrate 1 after step 601, sequentially depositing the first insulating layer 3 with a thickness of 1000~3000 Å, the first semiconductor layer 4 with a thickness of 1000~3000 Å, the semiconductor insulating layer 5 with a thickness of 1000~3000 Å, the second semiconductor layer 6 with a thickness of 1000~3000 Å, and the ohmic contact layer 7 with a thickness of 300~1000 Å by a plasma enhanced chemical vapor deposition (PECVD). The materials for the first insulating layer 3 and the semiconductor insulating layer 5 may be oxide, nitride or oxynitride, and corresponding reaction gas for the first insulating layer 3 and the semiconductor insulating layer 5 may be a mixture gas of $SiH_4$, $NH_3$ and $N_2$, or $SiH_2Cl_2$, $NH_3$ and $N_2$. Corresponding reaction gas for the semiconductor layers may be a mixture gas of $SiH_4$ and $H_2$, or $SiH_2Cl_2$ and $H_2$, and corresponding reaction gas for the ohmic contact layer 7 may be a mixture gas of $SiH_4$, $PH_3$ and $H_2$, or $SiH_2Cl_2$, $PH_3$ and $H_2$.

Figure 3A:
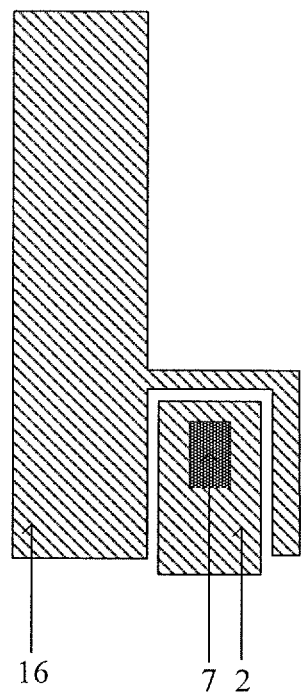
FIG. 3a is a plan view of the TFT array substrate after a second photolithograph process according to the first embodiment of the present invention.
Figure 3B:
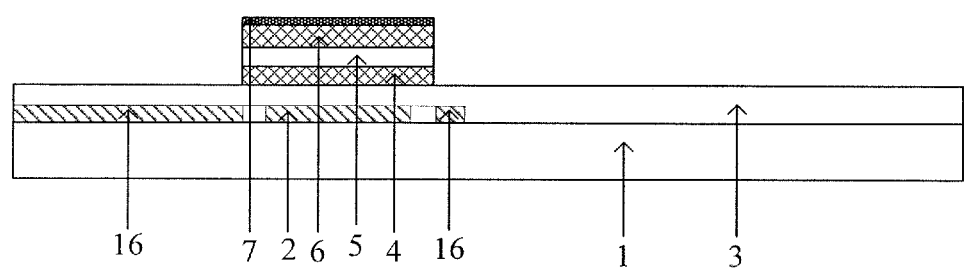

Then, forming the active thin film pattern as shown in FIG. 3a and FIG. 3b by a photolithograph process. The stacked layers of the first semiconductor layer 4, the semiconductor insulating layer 5, the second semiconductor layer 6 and the ohmic contact layer 7 are patterned into an island shape corresponding to the gate light blocking portion 2.

Step 603, forming a source electrode 9 and a drain electrode 10 of a thin film transistor, a data scanning line 14 connected to the source electrode 9 and a pixel electrode 8 connected to the drain electrode 10 on the base substrate 1, on which the active thin film pattern has been formed, by a photolithograph process, and the data scanning line 14 corresponds to the light blocking portion 16.

Firstly, on the base substrate 1 after step 602, sequentially depositing a transparent conductive thin film 17 with a thickness of 300~600 Å and a data line metal thin film 18 with a thickness of 2000~4000 Å by a sputtering method or a thermal evaporation method. The material for the transparent conductive thin film may be ITO or IZO, or may be other transparent metal or transparent metal oxide. The material for the data line metal thin film may be selected from the group consisting of Cr, W, Ti, Ta, Mo, Al, Cu and the like, and an alloy thereof, and the data line metal thin film may be formed in a single layer or multiple layers.

Figure 4A:
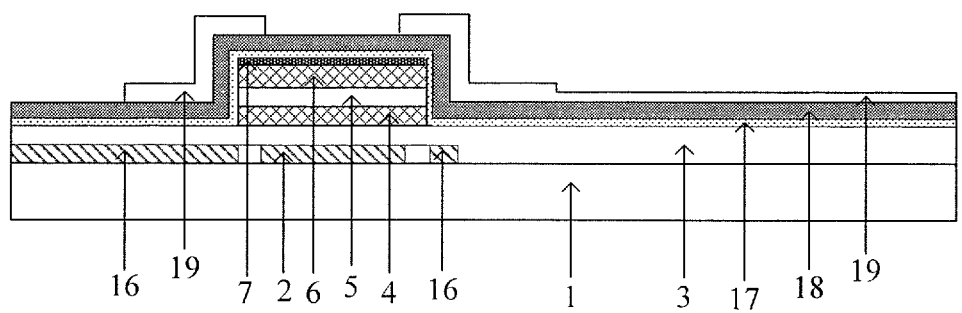
FIG. 4a is a sectional view taken along the A-B direction of the TFT array substrate after the exposing and developing processes in a third photolithograph process according to the first embodiment of the present invention.

Then, coating a photoresist layer on the base substrate 1 on which the transparent conductive thin film 17 and the data line metal thin film 18 are formed, and exposing and developing the photoresist by using a double-tone mask (e.g., a gray-tone mask or a half-tone mask) to form a completely exposed region (corresponding to a channel and the regions other than the data scanning line 14, the source electrode 9, the drain electrode 10 and the pixel electrode region), an unexposed region (corresponding to the data scanning line 14, the source electrode 9 and the drain electrode 10) and a partially exposed region (corresponding to the pixel electrode region), as shown in FIG. 4a. After a development process, the thickness of the photoresist in the partially exposed region is smaller than the thickness of the photoresist in the unexposed region, and the photoresist in the completely exposed region is removed, so that a photoresist mask is obtained.

Figure 4B:
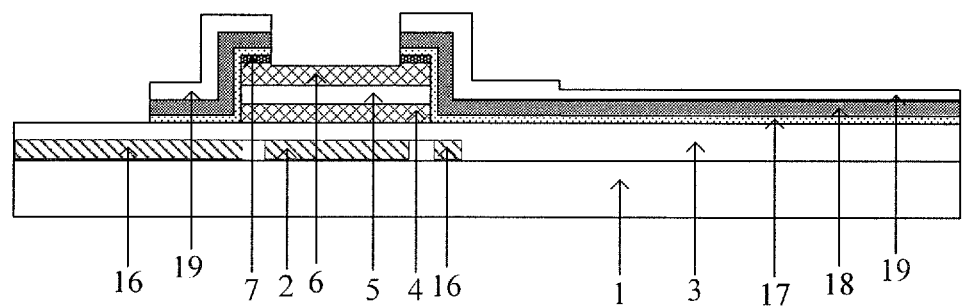
FIG. 4b is a sectional view taken along the A-B direction of the TFT array substrate after a first etching process in the third photolithograph process according to the first embodiment of the present invention.

Then, removing the ohmic contact layer 7, the transparent conductive thin film 17 and the source/drain metal thin film 18 in the completely exposed region by an etching process to define the channel of the TFT and form the patterns of the data scanning line 14, the source electrode 9, the drain electrode 10 and the pixel electrode region, as shown in FIG. 4b.

Figure 4C:
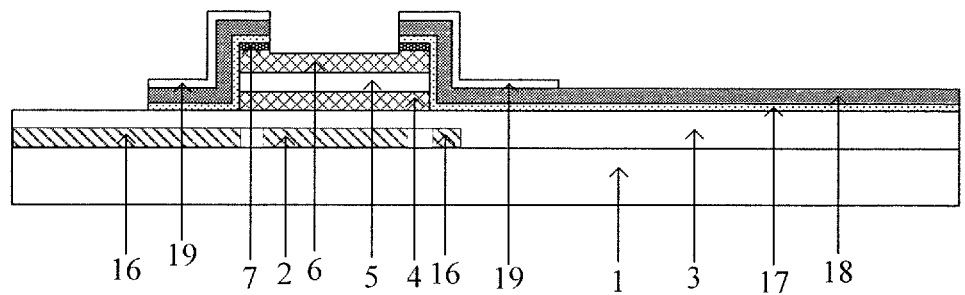
FIG. 4c is a sectional view taken along the A-B direction of the TFT array substrate after an ashing process in the third photolithograph process according to the first embodiment of the present invention the present invention.

Next, removing the photoresist 19 in the partially exposed region by an ashing process to expose the source/drain metal thin film in this region, as shown in FIG. 4c. The thickness of the photoresist in the unexposed region is thinned accordingly but left.

Figure 4D:
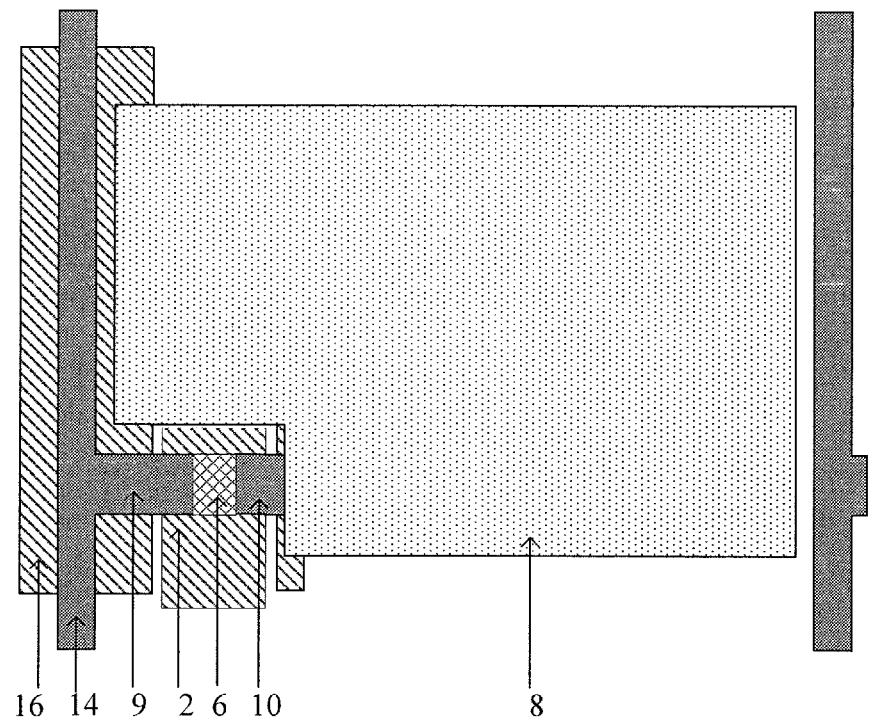
FIG. 4d is a plan view of the TFT array substrate after the third photolithograph process according to the first embodiment of the present invention.
Figure 4E:
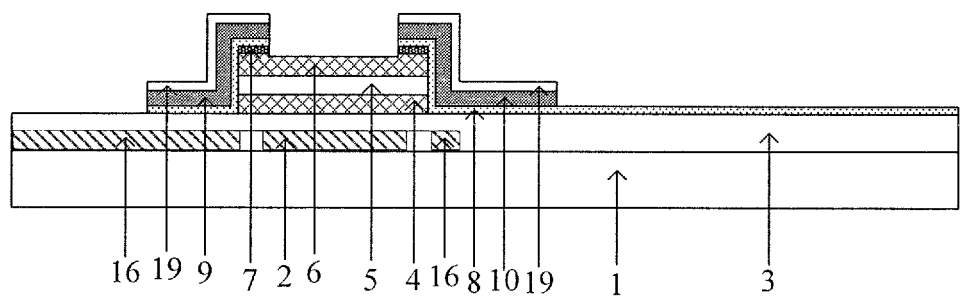
FIG. 4e is a sectional view taken along the A-B direction of FIG. 4d.

Then, removing the source/drain metal thin film in the partially exposed region by using a process to etch the source/drain metal film to form the data scanning line 14, the pixel electrode 8, the source electrode 9 and the drain electrode 10 as shown in FIG. 4d and FIG. 4e, wherein the source electrode 9 and the data scanning line 14 are connected to each other, and the drain electrode 10 and the pixel electrode 8 are connected to each other. The light blocking layer 16 corresponds to the thin film transistor and the data scanning line 14.

Last, removing the photoresist 19 retaining on the data scanning line 14, the source electrode 9 and the drain electrode 10.

Here, as shown in FIGS. 4a and 4d, the regions of the data scanning line 14, the source electrode 9 and the drain electrode 10 are covered by the photoresist, that is, the unexposed region; the region of the pixel electrode 8 is the partially exposed region; and the rest regions are the completely exposed region. Herein, a positive type photoresist is taken as an example for the explanation; and obviously a negative type photoresist can be used similarly.

Step 604, depositing a second insulating layer 11 on the base substrate 1 on which the pixel electrode 8, the data scanning line 14, the source electrode 9 and the drain electrode 10 have been formed, and forming a via hole 15 extending to the gate light blocking portion 2 by a photolithograph process.

Firstly, on the base substrate 1 after step 603, depositing the second insulating layer 11 with a thickness of 3000~5000 Å by a PECVD method. The material for the second insulating layer 11 may be oxide, nitride or oxynitride, and corresponding reaction gas may be a mixture gas of $SiH_4$, $NH_3$ and $N_2$, or $SiH_2Cl_2$, $NH_3$ and $N_2$.

Figure 5A:
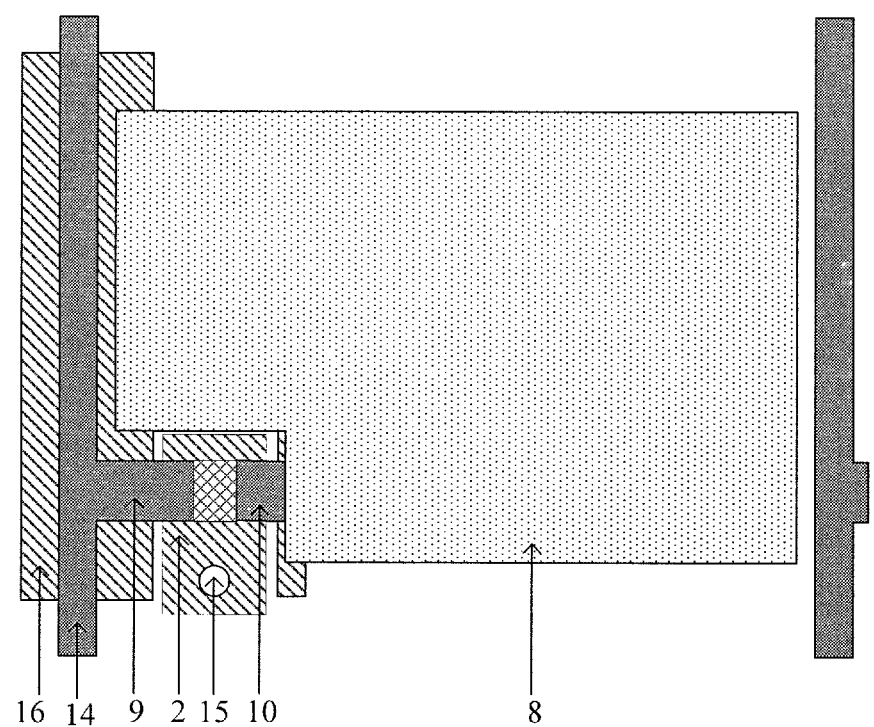
FIG. 5a is a plan view of the TFT array substrate after a fourth photolithograph process according to the first embodiment of the present invention.
Figure 5B:
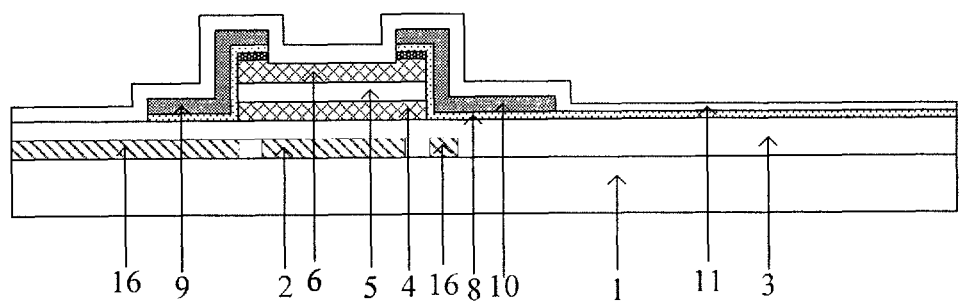

Then, forming the via hole 15 penetrating to the gate light blocking portion 2 by a photolithograph process, wherein the via hole 15 is located outside of the channel of the thin film transistor, as shown in FIG. 5a and FIG. 5b.

Step 605, forming a gate electrode 12 corresponding to the active thin film pattern of the thin film transistor and a gate scanning line 13 connected to the gate electrode 12 on the base substrate 1, on which the second insulating layer 11 has been deposited, by a photolithograph process.

Firstly, on the base substrate 1 after step 604, depositing a gate metal film 20 with a thickness of about 500~4000 Å by a sputtering method or a thermal evaporation method, and the material for the gate metal film may be selected from the group consisting of Cr, W, Ti, Ta, Mo, Al, Cu and the like, and an alloy thereof, and the gate metal film may be formed in a single layer or multiple layers (the gate metal is deposited in the via hole, and thus the gate electrode and the gate light blocking portion are connected to each other).

Figure 5C:
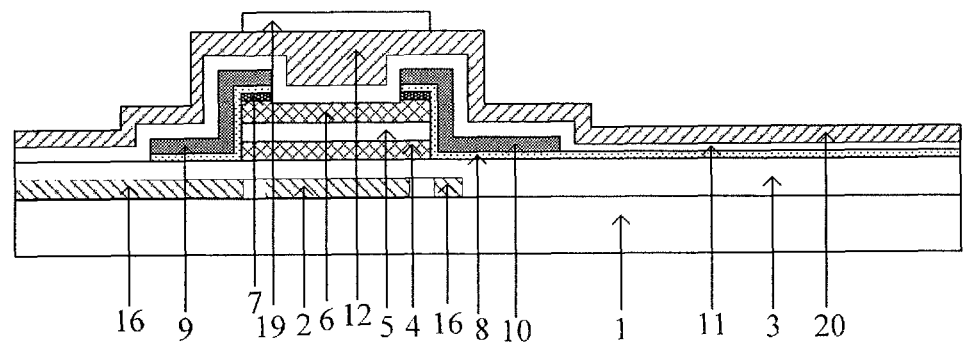
FIG. 5c is a sectional view taken along the A-B direction of the TFT array substrate after the exposing and developing processes in a fifth photolithograph process according to the first embodiment of the present invention.

Lastly, exposing a coated photoresist layer on the gate metal film 20 and developing the exposed region with a normal mask to form a photoresist pattern 19, as shown in FIG. 5c.

Next, removing the gate metal film 20 in the exposed region by an etching process to form the gate scanning line 13 and the gate electrode 12, and then removing the photoresist pattern 19 retaining on the gate scanning line 13 and the gate electrode 12. As shown in FIG. 1a and FIG. 1b, in the resultant structure, the gate electrode 12 and the gate scanning line 13 are connected to each other, the gate electrode 12 corresponds to the active thin film pattern of the TFT, the area of the gate electrode 12 is larger than the area of the gate light blocking portion 2, and when viewed from directly above of the gate electrode 12, the gate electrode 12 covers the gap "g" between the gate light blocking portion 2 and the scanning line light blocking portion 16.

In the method of manufacturing the TFT array substrate according to the embodiment of the present invention, the light blocking layer is directly formed on the base substrate and located below the later formed TFT array, and can prevent the light from the backlight having transmitted through base substrate from directly radiating onto the active thin film pattern, and the gate electrode in an upper layer can prevent the light within the liquid crystal panel after reflected by the black matrix from radiating onto the semiconductor layer at the channel of the TFT. Further, the gate electrode also can prevent other light within the liquid crystal panel from directly radiating onto the semiconductor layer at the channel of the TFT, and thus, the generation of dark current can be avoided, and the retaining time of pixel charges can be maintained, and the display quality of the TFT-LCD can be improved. Two semiconductor layers are formed between the gate electrode and the gate light blocking portion, a via hole is formed through each of layers between the gate electrode and the gate light blocking portion and the gate, and the gate light blocking portion are connected to each other via the conductive material filled in the via hole, and thus, the double-channel TFT is formed and the electrical property of the TFT can be improved.

In a variation of the first embodiment, the active thin film may comprise one semiconductor layer only, and thus, a double-gate structure is formed. In another variation, the light blocking layer also comprises a gate scanning line light blocking portion corresponding to the gate scanning line and spaced from the gate light blocking portion.

Second Embodiment

The present embodiment provides a TFT array substrate, and the difference from that of the first embodiment lies in that the gate scanning line 13 and the gate electrode 12 are directly formed on the base substrate 1 and the light blocking layer is formed above the channel of the TFT in the present embodiment.

Figure 6A:
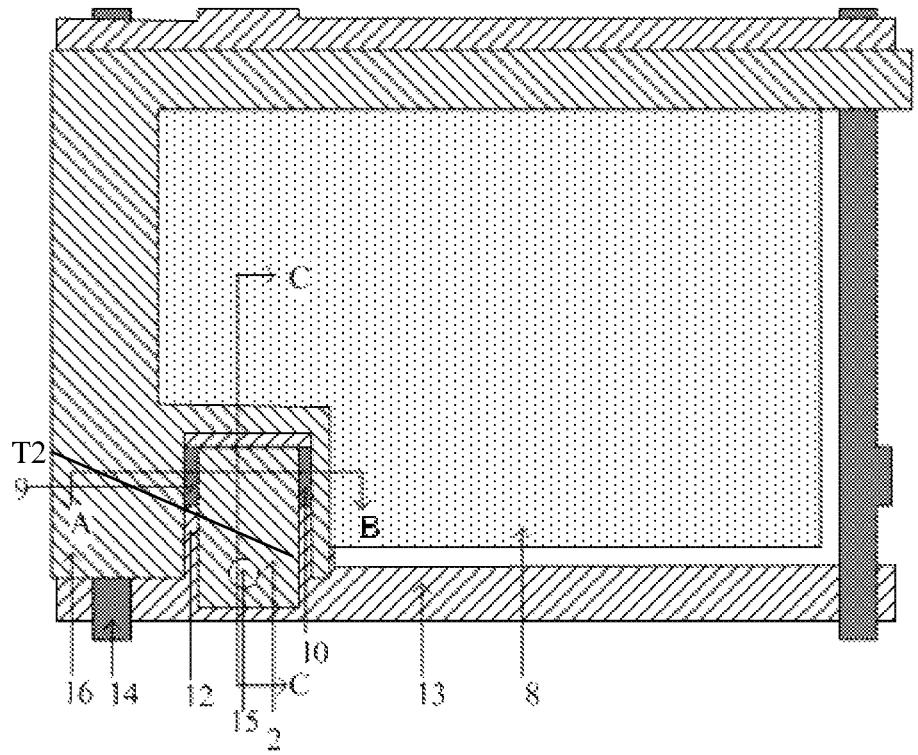
FIG. 6a is a plan view of a TFT array substrate according to a second embodiment of the present invention.
Figure 6B:
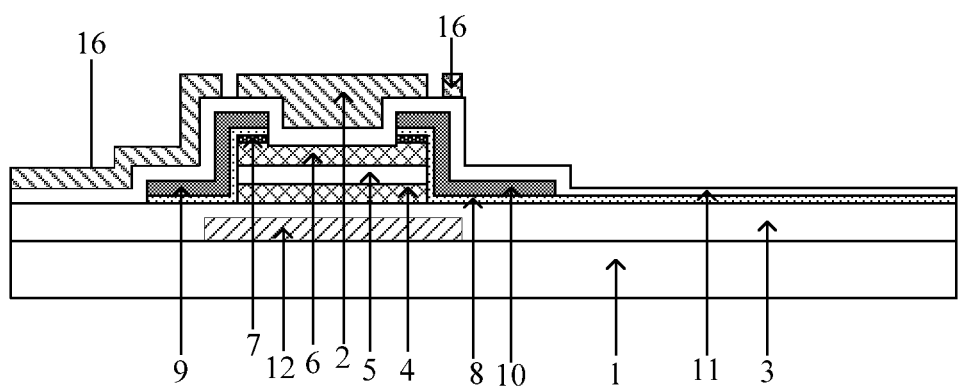
Figure 6C:
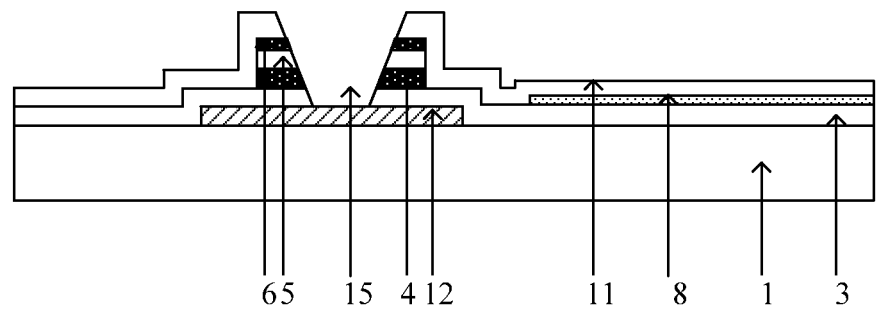
FIG. 6C is a sectional view taken along the C-C direction of FIG. 6a before the light blocking layer is formed.
Figure 6D:
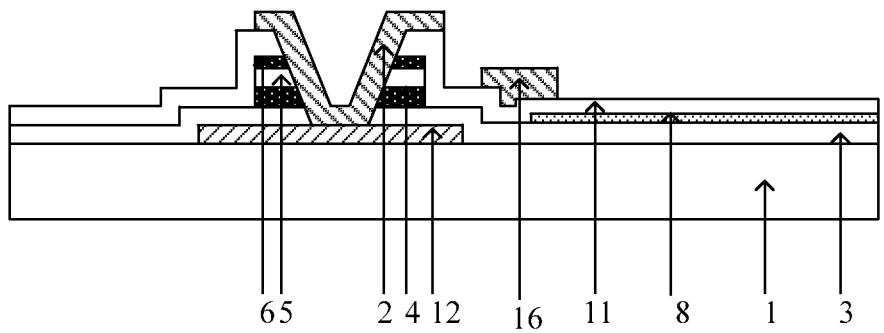
FIG. 6D is a sectional view taken along the C-C direction of FIG. 6a after the light blocking layer is formed.

As shown in FIG. 6a and FIG. 6b, the TFT array substrate comprises: the base substrate 1; and the gate scanning line 13, a data scanning line 14, a pixel electrode 8 and a thin film transistor T2 formed on the base substrate 1. The gate electrode 12 of the thin film transistor T2 and the gate scanning line 13 are formed with a same metal layer by a photolithograph process and are connected to each other, and a source electrode 9 is connected to the data scanning line 14, and a drain electrode 10 is connected to the pixel electrode 8. The light blocking layers 2 and 16 respectively corresponding to the thin film transistor and the data scanning line 14 are formed on the base substrate 1.

Further, the gate electrode 12 and the gate scanning line 13 are formed on the base substrate 1, and a first insulating layer 3 is formed on the gate electrode 12 and the gate scanning line 13 on the base substrate 1. The gate electrode 12 corresponds to the channel of the thin film transistor, and the data scanning line 14, the pixel electrode 8 and the thin film transistor are formed on the first insulating layer 3 on the base substrate 1.

A second insulating layer 11 is formed on the data scanning line 14 and the thin film transistor on the base substrate 1, and the light blocking layer are formed on the second insulating layer 11.

The light blocking layer comprises two portions: a gate light blocking portion 2 and a scanning line light blocking portion 16. The gate light blocking portion 2 corresponds to the gate electrode 12, the scanning line light blocking portion 16 corresponds to the data scanning line 14, and there is a gap "g" between the gate light blocking portion 2 and the scanning line light blocking portion 16.

A via hole 15 is formed through each of layers between the gate electrode 12 and the gate light blocking portion 2, the via hole 15 is positioned outside of the channel of the thin film transistor, and the gate light blocking portion 2 is connected to the gate electrode 12 via the conductive material filled in the via hole 15.

An active thin film pattern is formed between the first insulating layer 3 and the second insulating layer 11, wherein the active thin film pattern comprises a first semiconductor layer 4 and a second semiconductor layer 6, the first semiconductor layer 4 is spaced from the second semiconductor layer 6 via a semiconductor insulating layer 5 between them, the first semiconductor layer 4 is an oxide semiconductor layer, and the second semiconductor layer 6 is an amorphous silicon layer.

The first semiconductor layer 4 is formed on the first insulating layer 3, the semiconductor insulating layer 5 is formed on the first semiconductor layer 4, the second semiconductor layer 6 is formed on the semiconductor insulating layer 5, an ohmic contact layer 7 is formed on the second semiconductor layer 6, the pixel electrode 8 is positioned on the ohmic contact layer 7, and the source electrode 9 and the drain electrode 10 are formed on the pixel electrode 8, wherein the data scanning line 14, the source electrode 9 and the drain electrode 10 are formed with a same metal layer by a lithography process, and the gate scanning line 13 and the gate electrode 12 are formed with a same metal layer by a lithography process. The gate electrode 12 is perpendicular to the gate scanning line 13, and the data scanning line 14 is perpendicular to the gate scanning line 13.

The gate electrode 12 and the gate light blocking portion 2 are connected to each other via the conductive material filled in the via hole 15 and two semiconductor layers are formed between the gate electrode 12 and the gate light blocking portion 2, so a double-channel TFT structure is obtained.

The area of the gate electrode 12 is larger than the area of the gate light blocking portion 2, and the gate electrode 12 covers the gap between the gate light blocking portion 2 and the scanning line light blocking portion 16, and thus, light can be prevented from transmitting through the gap between the gate light blocking portion 2 and the scanning line light blocking portion 16.

The embodiment of the present invention provides the TFT array substrate, wherein a light blocking layer is disposed above the TFT array, and when the light from the backlight is radiated onto a black matrix of a color filter substrate and reflected towards the TFT array substrate, the light blocking layer can prevent the light from radiating onto the semiconductor layer at the channel of the TFT, and thus, the generation of dark current can be avoided, and the retaining time of pixel charges can be maintained, and the display quality of the TFT-LCD can be improved. The two semiconductor layers are formed between the gate electrode and the gate light blocking portion, the gate electrode and the gate light blocking portion are connected to each other via the conductive material filled in the via hole, and thus, the double-channel TFT structure is formed, and the electrical property of the TFT can be improved.

Further, the embodiment of the present invention also provides a method of manufacturing a TFT array substrate. The difference from the method of the first embodiment lies in that a gate scanning line and a gate electrode are firstly formed on a base substrate and a light blocking layer is last formed above the channel of the TFT. The method comprises the following steps.

Step 801, forming a gate electrode 12 of the thin film transistor and a gate scanning line 13 connected to the gate electrode 12 on a base substrate 1 by using a photolithograph process.

Firstly, depositing a gate metal film with a thickness of about 500~4000 Å on the base substrate 1 by a sputtering method or a thermal evaporation method, wherein the material for the gate metal film may be selected from the group consisting of Cr, W, Ti, Ta, Mo, Al, Cu and the like, and an alloy thereof, and the gate metal film may be formed in a single layer or multiple layers.

Then, exposing a coated photoresist layer on the gate metal film by a normal mask, and developing the exposed region.

Then, removing the gate metal film in the exposed region by an etching process to form the gate electrode 12 and the gate scanning line 13 connected to the gate electrode 12.

Last, removing the photoresist retaining on the gate scanning line 13 and the gate electrode 12.

Step 802, sequentially depositing a first insulating layer 3, a first semiconductor layer 4, a semiconductor insulating layer 5, a second semiconductor layer 6 and an ohmic contact layer 7 on the base substrate 1 on which the gate electrode 12 and the gate scanning line 13 have been formed, and then by using a photolithograph process, forming an active thin film pattern.

The detailed steps can be referred to step 602, so they are omitted for simplicity.

Step 803, forming a source electrode 9 and a drain electrode 10 of the thin film transistor, a data scanning line 14 connected to the source electrode 9 and a pixel electrode 8 connected to the drain electrode 10 on the base substrate 1 on which the active thin film pattern is formed by a photolithograph process. The details can be referred to step 603, so they are omitted for simplicity.

Step 804, depositing a second insulating layer 11 on the base substrate 1 on which the pixel electrode 8, the data scanning line 14, the source electrode 9 and the drain electrode 10 have been formed, and forming a via hole 15 extending to the gate electrode 12 by a photolithograph process, wherein the via hole 15 is located outside of the channel of the thin film transistor. The detailed steps can be referred to step 604, so it is omitted for simplicity.

Step 805, forming a gate light blocking portion 2 corresponding to the thin film transistor and a scanning line light blocking portion 16 corresponding to the data scanning line 14 by using a photolithograph process on a base substrate 1 on which the second insulating layer 11 has been deposited.

Firstly, on the base substrate 1 after step 804, depositing a light-blocking metal thin film with a thickness of 1000~4000 Å by a sputtering method or a thermal evaporation method. The light-blocking metal thin film may be formed of Cr or other metal having the excellent light-blocking property.

Then, forming the gate light blocking portion 2 and the scanning line light blocking portion 16 on the base substrate 1 on which the light-blocking metal thin film has been deposited by a photolithograph process. The gate light blocking portion 2 is connected to the gate electrode 12 via the conductive material filled in the via hole 15, and there is a gap between the gate light blocking portion 2 and the scanning line light blocking portion 16. The area of the gate electrode 12 is larger than the area of the gate light blocking portion 2, and the gate electrode 12 covers the gap between the gate light blocking portion 2 and the scanning line light blocking portion 16.

In the method of manufacturing the TFT array substrate according to the embodiment of the present invention, the light blocking layer is formed above the TFT array, and when the light from the backlight is radiated onto a black matrix of a color filter substrate and reflected towards the TFT array substrate, the light blocking layer can prevent the light from radiating onto the semiconductor layer at the channel of the TFT, and thus, the generation of dark current can be avoided, and the retaining time of pixel charges can be maintained and the display quality of the TFT-LCD can be improved. The two semiconductor layers are formed between the gate electrode and the gate light blocking portion, the via hole is formed through each of layers between the gate electrode and the gate light blocking portion and the gate electrode and the gate light blocking portion are connected to each other via the conductive material filled in the via hole, and thus, the double-channel TFT structure is formed and the electrical property of the TFT can be improved.

In a variation of the second embodiment, the active thin film may comprise one semiconductor layer only, and thus, a double-gate structure is formed. In another variation, the light blocking layer also comprises a gate scanning line light blocking portion corresponding to the gate scanning line and spaced from the gate light blocking portion.

Third Embodiment

Figure 7:
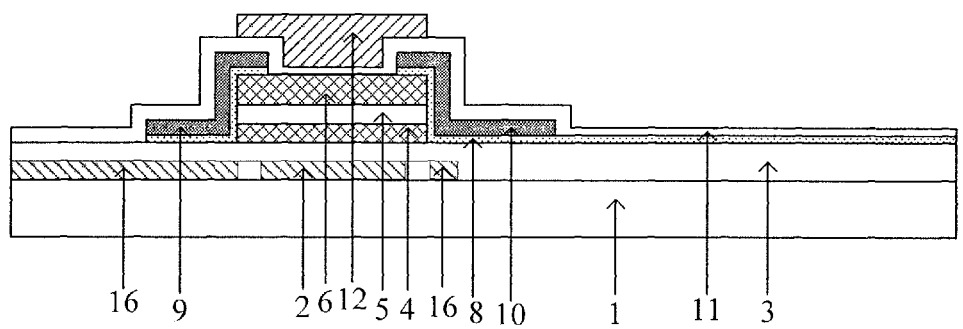
FIG. 7 is a sectional view taken along the A-B direction of a TFT array substrate according to a third embodiment of the present invention.

The present embodiment provides a TFT array substrate, the structure of the TFT array substrate can be referred to the structure of the TFT array substrate of the first embodiment, and as shown in FIG. 7, the difference from the structure of the first embodiment lies in that, in the present embodiment, the materials for the first semiconductor layer 4 and the second semiconductor layer 6 are both an oxide semiconductor, there is no an ohmic contact layer formed on the second semiconductor layer 6, and a pixel electrode 8 is located on the second semiconductor layer 6.

Correspondingly, this embodiment of the present invention also provides a method for manufacturing a TFT array substrate. The method comprises the following steps.

Step 1001, identical to step 601, so it is omitted for simplicity.

Step 1002, sequentially depositing a first insulating layer 3, a first semiconductor layer 4, a semiconductor insulating layer 5 and a second semiconductor layer 6 on the base substrate 1 on which the gate light blocking portion 2 and the scanning line light blocking portion 16 have been formed, and then by using a photolithograph process, forming an active thin film pattern.

Step 1003, forming a source electrode 9 and a drain electrode 10 of a thin film transistor, a data scanning line 14 connected to the source electrode 9 and a pixel electrode 8 connected to the drain electrode 10 by a photolithograph process on the base substrate 1 on which the active thin film pattern has been formed, wherein the thin film transistor corresponds to the gate light blocking portion 2 and the data scanning line 14 corresponds to the light blocking portion 16.

Step 1003 is different from step 603 of the first embodiment only in that, because there is no an ohmic contact layer deposited in step 1002, during the etching process, the transparent conductive thin film and the source/drain metal thin film in the completely exposed region are removed to form the channel of the TFT.

Step 1004-1005, identical to step 604-605, so they are omitted for simplicity.

The embodiment of the present invention provides a TFT array substrate and a method thereof, wherein the light blocking layer is directly formed on the base substrate, the light blocking layer is located below the TFT array and can prevent the light from the backlight having transmitted through TFT array substrate from directly radiating onto the active thin film pattern, and the gate electrode on an upper layer can prevent the light within the liquid crystal panel after reflected by a black matrix from radiating onto the semiconductor layer at the channel of the TFT. Further, the gate electrode can also prevent other light within the liquid crystal panel from directly radiating onto the semiconductor layer at the channel of the TFT, and thus, the generation of dark current can be avoided, and the retaining time of pixel charges can be maintained and the display quality of the TFT-LCD can be improved. The two semiconductor layers are formed between the gate electrode and the gate light blocking portion, the via hole is formed through each of layers between the gate electrode and the gate light blocking portion and the gate electrode and the gate light blocking portion are connected to each other via the conductive material filled in the via hole, and thus, the double-channel TFT structure is formed and the electrical property of the TFT can be improved.

Fourth Embodiment

Figure 8:
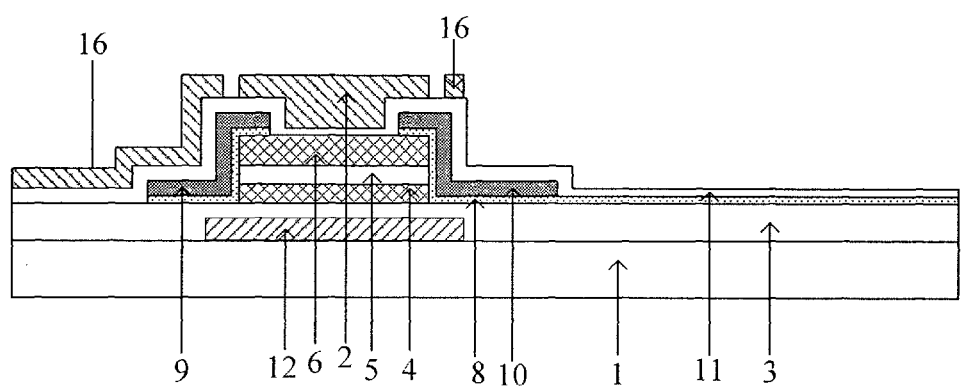
FIG. 8 is a sectional view taken along the A-B direction of a TFT array substrate according to a fourth embodiment of the present invention.

The present embodiment provides a TFT array substrate, the structure of the TFT array substrate can be referred to the structure of the TFT array substrate of the second embodiment, and as shown in FIG. 8, the difference from the structure of the second embodiment lies in that, in the present embodiment, the material of a first semiconductor layer 4 and a second semiconductor layer 6 are both an oxide semiconductor, there is no an ohmic contact layer formed on the second semiconductor layer 6, and a pixel electrode 8 is located on the second semiconductor layer 6.

Correspondingly, an embodiment of the present invention also provides a method for manufacturing a TFT array substrate. The method comprises the following steps.

Step 1201, identical to step 801, so it is omitted for simplicity.

Step 1202, sequentially depositing a first insulating layer 3, a first semiconductor layer 4, a semiconductor insulating layer 5 and a second semiconductor layer 6 on the base substrate 1 on which the gate electrode 12 and the gate scanning line 13 have been formed, and then by using a photolithograph process, forming an active thin film pattern.

Step 1203, forming a source electrode 9 and a drain electrode 10 of a thin film transistor, a data scanning line 14 connected to the source electrode 9 and a pixel electrode 8 connected to the drain electrode 10 by a photolithograph process on the base substrate 1 on which the active thin film pattern has been formed.

Step 1203 is different from step 803 of the second embodiment only in that, because there is no an ohmic contact layer deposited in step 1202, during the etching process, the transparent conductive thin film and the source/drain metal thin film in the completely exposed region are removed to form the channel of the TFT.

Step 1204-1205, identical to step 804-805, so they are omitted for simplicity.

The embodiment of the present invention provides a TFT array substrate and the method thereof, wherein the light blocking layer is disposed above the TFT array, and when the light from the backlight is radiated onto a black matrix of a color filter substrate and reflected towards TFT array substrate, the light blocking layer can prevent the light from radiating onto the semiconductor layer at the channel of the TFT, and thus, the generation of dark current can be avoided, and the retaining time of pixel charges can be maintained and the display quality of the TFT-LCD can be improved. The two semiconductor layers are formed between the gate electrode and the gate light blocking portion, the via hole is formed through each of layers between the gate electrode and the gate light blocking portion and the gate electrode and the gate light blocking portion are connected to each other via the conductive material filled in the via hole, and thus, the double-channel TFT structure is formed and the electrical property of the TFT can be improved.

Another embodiment of the present invention relates to a liquid crystal display, and the liquid crystal display comprises any one TFT array substrate as descried above and a color filter substrate.

The above description only describes detailed embodiments of the present invention, and it is not a limitation of the protection scope of the present invention. Accordingly, it should be understood that many modifications or alternation which can be made easily by those of ordinary skill in the art within the disclosure of the present invention, will fall within the scope of the present invention as defined by the appended claims.

What is claimed is:

1. An array substrate, comprising:
   a base substrate;
   a gate scanning line, a data scanning line, a pixel electrode and a thin film transistor, formed on the base substrate; and
   a light blocking layer, formed on the base substrate and corresponding to the thin film transistor and the data scanning line,
   wherein an active thin film pattern is formed between a first insulating layer formed on the light blocking layer or the gate scanning line and a second insulating layer formed on the data scanning line, the pixel electrode and the thin film transistor, the active thin film pattern comprises two semiconductor layers, and the two semiconductor layers are spaced from each other via a semiconductor insulating layer,
   in a direction perpendicular to a plane where the gate electrode is located, the two semiconductor layers are disposed in different layers and completely overlap with each other, so that a double-channel TFT structure is formed,
   wherein the light blocking layer comprises a gate light blocking portion and a scanning line light blocking portion, the double-channel TFT structure is a double-gate structure in which the gate electrode and the gate light blocking portion are configured as two gate electrodes of the double-channel TFT structure.

2. The array substrate as claimed in claim 1, wherein the light blocking layer is formed on the base substrate the data scanning line, the pixel electrode and the thin film transistor are formed on the first insulating layer; and
   a gate electrode of the thin film transistor and the gate scanning line are formed on the second insulating layer, and the gate electrode corresponds to a channel of the thin film transistor.

3. The array substrate as claimed in claim 1, wherein the material for the light blocking layer comprises a metal having the light blocking property.

4. The array substrate as claimed in claim 1, wherein the gate light blocking portion corresponds to the gate electrode, and the scanning line light blocking portion corresponds to the data scanning line.

5. The array substrate as claimed in claim 4, wherein there is a gap between the gate light blocking portion and the scanning line light blocking portion.

6. The array substrate as claimed in claim 5, wherein a via hole is formed through each of layers between the gate electrode and the gate light blocking portion, the via hole is located outside of a channel of the thin film transistor, and the gate light blocking portion is connected to the gate electrode via a conductive material filled in the via hole.

7. The array substrate as claimed in claim 5, wherein an area of the gate electrode is larger than an area of the gate light blocking portion, and the gate electrode covers the gap between the gate light blocking portion and the scanning line light blocking portion.

* * * * *